United States Patent
Hall

(10) Patent No.: US 7,487,073 B2
(45) Date of Patent: Feb. 3, 2009

(54) USING SYMBOLIC EVALUATION TO VALIDATE MODELS THAT HAVE INCOMPLETE INFORMATION

(75) Inventor: Robert J. Hall, Berkeley Heights, NJ (US)

(73) Assignee: AT&T Corp., New York, NY (US)

( * ) Notice: Subject to any disclaimer, the term of this patent is extended or adjusted under 35 U.S.C. 154(b) by 572 days.

(21) Appl. No.: 10/770,759

(22) Filed: Feb. 3, 2004

(65) Prior Publication Data

US 2004/0243951 A1 Dec. 2, 2004

Related U.S. Application Data

(60) Provisional application No. 60/472,362, filed on May 21, 2003.

(51) Int. Cl.
*G06G 7/48* (2006.01)
(52) U.S. Cl. .................. 703/6; 716/4; 714/38; 706/46
(58) Field of Classification Search .............. 706/6, 706/12, 46; 709/201; 703/6; 716/2, 4; 714/E11.02, 714/37, 38
See application file for complete search history.

(56) References Cited

U.S. PATENT DOCUMENTS 6,591,400 B1 * 7/2003 Yang ................ 716/2

2003/0208732 A1 11/2003 Yang ................ 716/4

OTHER PUBLICATIONS

Hall, Robert J., "Open Modeling in Multi-stakeholder Distributed Systems: Modell-based Requirements Engineering for the 21st Century" XP007901308 (retrieved by EPO examiner on Nov. 3, 2006 from ftp://ftp.research.att .com/dist/hall/papers/openmodel/openmodel-asewshp02.pdf>).

Hall, Robert J., "Specification, Validation, and Synthesis of Email Agent Controllers: A Case Study in Function Rich Reactive System Design," XP002407620, *Automated Software Engineering*. 9, 233-261 (Kluwer Academic Publishers, Netherlands, 2002).

* cited by examiner

*Primary Examiner*—Russell Frejd

(57) ABSTRACT

An arrangement calculates a description of potential responses of a distributed system in response to at least one input stimulus. The distributed system including nodes whose operation is described by respective node behavior descriptions. The method involves applying symbolic evaluation to plural node behavior descriptions so as to produce plural response descriptions that describe responses of nodes, and combining at least the plural response descriptions so as to arrive at the description of potential responses of the distributed system.

19 Claims, 5 Drawing Sheets

USING SYMBOLIC EVALUATION TO VALIDATE MODELS THAT HAVE INCOMPLETE INFORMATION

CROSS-REFERENCE TO RELATED APPLICATION

This patent application claims priority to corresponding U.S. provisional application 60/472,362, filed May 21, 2003, to Robert J. Hall.

BACKGROUND OF THE INVENTION

1. Field of the Invention

The invention generally relates to arrangements for validating models having incomplete information. More particularly, the invention relates to arrangements for validating Multi-Stakeholder Distributed Systems (MSDSs) having nodes whose structure and operation are not completely or accurately known.

2. Related Art

Behavioral modeling (of, for example, compute networks or software systems in general) can be applied to help users understand and predict system behavior, to help administrators comprehend and debug configurations, and to help developers better analyze the potential interactions of a new service with its online environment. However, in order to produce results, conventional behavioral modeling requires access to fully detailed configuration and operational data of all relevant nodes of a system. It would be desirable to know in detail (have a model demonstrating) how each node computes its outputs from its inputs, more than a mere I/O description. Unfortunately, for a variety of reasons, node deployers are unwilling or unable to provide complete or accurate data. Thus, a key problem is to design, use, or debug a system while ignorant of how most of its nodes work.

Multi-Stakeholder Distributed Systems (MSDSs) may be defined as distributed systems in which nodes are designed, owned, or operated by different stakeholders in ignorance of one another and with different, possibly conflicting goals. Examples include the email system, networks of web services, telephone networks, the Internet as a whole, and so forth. Such MSDSs have globally inconsistent high-level requirements, and therefore have behavior that is impossible to validate according to the usual meaning of the term. In general, as the term will be used in this disclosure, a "validation process" may be a process in which a client (such as, for example, a human user) states a requirement describing a system behavior, and in which a validation tool/method then evaluates whether the system meets the stated requirement.

All users, administrators, and developers of networked services, in either the public Internet or within corporate or government intranets, face the problems mentioned above. Thus, there is a need for a technique for tolerating incomplete data in the validation process, so that benefits of behavioral modeling can still be obtained, even though node deployers are unwilling or unable to provide complete or accurate data.

SUMMARY

An arrangement calculates a description of potential responses of a distributed system in response to at least one input stimulus. The distributed system including nodes whose operation is described by respective node behavior descriptions. The method involves applying symbolic evaluation to plural node behavior descriptions so as to produce plural response descriptions that describe responses of nodes, and combining at least the plural response descriptions so as to arrive at the description of potential responses of the distributed system.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which.

DETAILED DESCRIPTION

Figure 1:
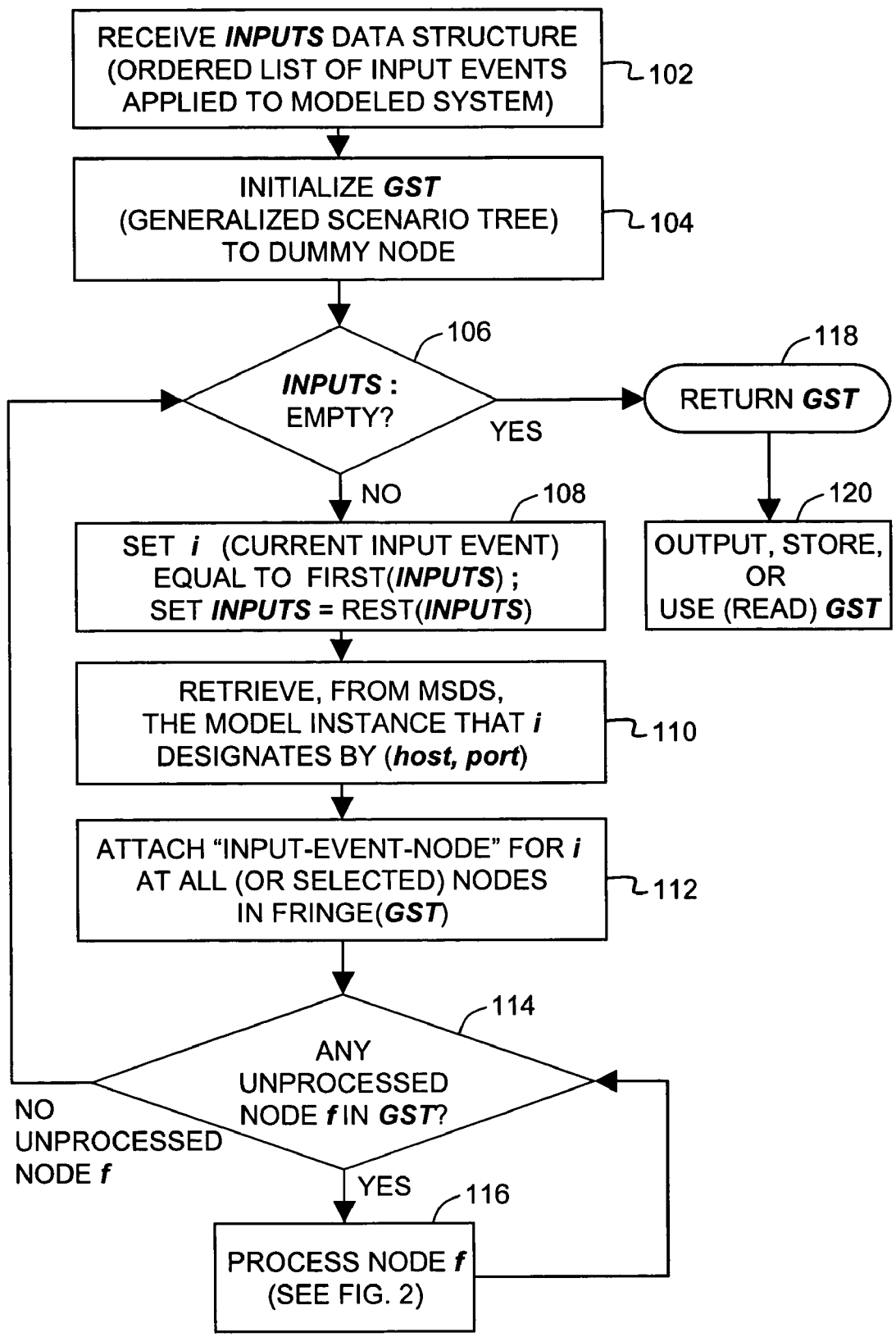
FIGS. 1-4 constitute a flowchart of an arrangement for using symbolic evaluation to validate models that have model instances with potentially incomplete or inaccurate information.

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. Various terms that are used in this specification are to be given their broadest reasonable interpretation when used to interpret the claims.

Moreover, features and procedures whose implementations are well known to those skilled in the art are omitted for brevity. For example, initiation and termination of loops, and the corresponding incrementing and testing of loop variables, may be only briefly mentioned or illustrated, their details being easily surmised by skilled artisans. Thus, the steps involved in methods described herein may be readily implemented by those skilled in the art without undue experimentation.

Further, various aspects, features and embodiments may be described as a process that can be depicted as a flowchart, a flow diagram, a structure diagram, or a block diagram. Although a flowchart may describe the operations as a sequential process, many of the operations can be performed in parallel, concurrently, or in a different order than that described. Operations not needed or desired for a particular implementation may be omitted. A process or steps thereof may correspond to a method, a function, a procedure, a subroutine, a subprogram, and so forth, or any combination thereof.

In the present technical description, certain terms in common usage may be used to more easily communicate with those skilled in the art. However, it is to be understood that those common-usage terms are merely employed as embodiments of broader concepts that may be recited in the claims. Accordingly, the scope of the claims should not be limited by particular references made in the specification.

As used herein, the term "symbolic evaluation" is intended to cover what those in the art may also call "symbolic execution," "partial evaluation," and the like.

As introduced in the Background, Multi-Stakeholder Distributed Systems (MSDSs) do not satisfy traditional assumptions of Requirements Engineering (RE). For example, conflicting stakeholder goals lead to inconsistent global requirements, and decentralized control leads to uncontrolled and chaotic change. Accordingly, the inventor has recognized that the problem focus should be changed from global to local, that is, changing the focus to personal, ephemeral requirements engineering. That is, the inventor has recognized that it would be desirable to change the problem from "Does the system do the right thing?" to a generally simpler problem "Will the system do the right thing for me (now)?"

But to solve that simpler problem, there is a need to predict behavior of the system on inputs of interest. The inventor has recognized that it is desirable to solve this by establishing open standards for behavioral modeling, in which each node provides (via http or through a central registry, for example) a behavioral model expressed in terms of shared domain-specific function/object theories. The present arrangement supports validation by assembling these models, and by simulating, animating, or formally analyzing the assembled model, thus helping the user to detect unfavorable behaviors or feature interactions in advance.

An important feature of the present validation arrangement is to use symbolic evaluation (as opposed to concrete testing or concrete simulation) over a distributed system model that lacks information, in order to reason about the correctness of the system. The arrangement combines symbolic evaluations of primitive sub-models to ultimately come to useful conclusions about the functionality of the system being modeled.

Before embarking on a detailed description of a motivating example and an implementation of a validation arrangement, the following definitions and descriptions are provided, with the understanding that the scope of the claims should not be limited to particular examples.

A "model" is a formal description of the behavior of a computational node or service within such a node. It could be represented in any of a variety of formalisms, such as, for example:
  a programming language such as C, Java, and so forth,
  a specification language such as P-EBF, Statecharts, SCR-language, Z, and so forth,
  a formal automata description such as Finite State Automaton, Infinite State Automaton, Bucchi Automaton, pushdown automaton, regular expressions, and so forth,
  other representations not specifically listed.

Each device (for example, computer) taking part in implementing a Multi-Stakeholder Distributed System (MSDS) may host a number of "nodes" of the (logical) MSDS within it, with each node identified uniquely within the device. Each such node may be described formally by a "model instance":
  <Model, Instance Data, Connections>

Typically, a model instance is an abstraction of a particular running service at a particular place and time in the network hosting the MSDS.

In general, a "validation process" may be a process in which a client (such as, for example, a human user) states a requirement describing a system behavior, and in which a validation tool/method then evaluates whether the system meets the stated requirement. The behavior stated by the client need not be a "desired" behavior. The client could also state an "undesired" behavior, and the validation process would attempt to determine whether the system could behave that way. For example, the client could ask whether it is possible that an email message will appear unencrypted (that is, be compromised) in transit between sender and desired recipient.

In one common class of validation processes, a client (user) states an input class he is interested in applying to the system as the requirement, and the validation process computes a set of possible outcomes and presents them to the user, who then determines whether they are desirable. In a variant of that technique, the system automatically evaluates the desirability of the possible outcomes and present to the user those that are determined to be definitely or possibly undesirable.

In one particular embodiment to which the scope of the invention should not be limited, a "validation process" may be considered to be a process of using symbolic reasoning to incrementally construct a tree of generalized scenarios (or Generalized Scenario Tree, abbreviated GST). During the validation process, a user supplies as much initial information as is available, and the validation process itself produces a tree of (classes of) possible outcomes. For example, one set of implementations of the validation process may involve iteration of steps:
  Applying current input event and symbolic evaluating to produce a tree of "actions" (output events, state changes).
  For each output event, a connector (or connector information) describes which model instance should receive the output event as input. Simplification/evaluation reduces to a concrete <host, id> pair. A suitable tool retrieves a next model instance from a host.

Generally, connector information is used to direct the flow of data or events between nodes of a system. In one embodiment, a particular type of connector information (in terms of host, port, and event transformation) is used, but one skilled in the art can readily recognize other styles of connector information could be used, including, for example:
  web URLs (uniform resource locators),
  graphical or abstract connection diagrams,
  implicit or explicit communication channels as specified in various formal languages allowing the expression of concurrency,
  other connector information not specifically listed.

In such implementations, each deduced event is appended to current (generalized) scenario tree (GST). Branching in result tree is caused by missing information. The output of process is full scenario tree. A user can examine each branch and evaluate the desirability of outcomes.

Per commonly accepted computer science terminology, a GST node x is "above" GST node y if x is a node on the path from y to the root node, including the root node but not y.

"Input stimulus" includes an "input event" in the common usage of the term. A reactive system (such as one represented by a node model) can have a range of different types of responses to an input stimulus. Input stimuli could include, for example:
  an "input event" per common usage of the term,
  a clock tick,
  a monitored-data-variable change,
  a sequence of input stimuli of arbitrary types (also known as "scenarios" or "partial scenarios," or can be viewed as such as "use cases"),
  a client's input stimulus specification,
  other stimuli not specifically listed.

"Response", including a "possible response," includes an intermediate or ultimate state change (or other occurrence) that takes place in response to an input event or other input stimulus:
  The concept of an intermediate occurrence, such as an intermediate state change, might include, for example:
    an e-commerce system storing private information in a database, a state change that might be of concern to a user,
    transient indications of data or control values),
    changes to internal state variables (including altering memory values, writing to disk, writing to other storage media),
    control actions applied to peripheral devices, other intermediate states change or other occurrence, not specifically listed.

Figure 5:
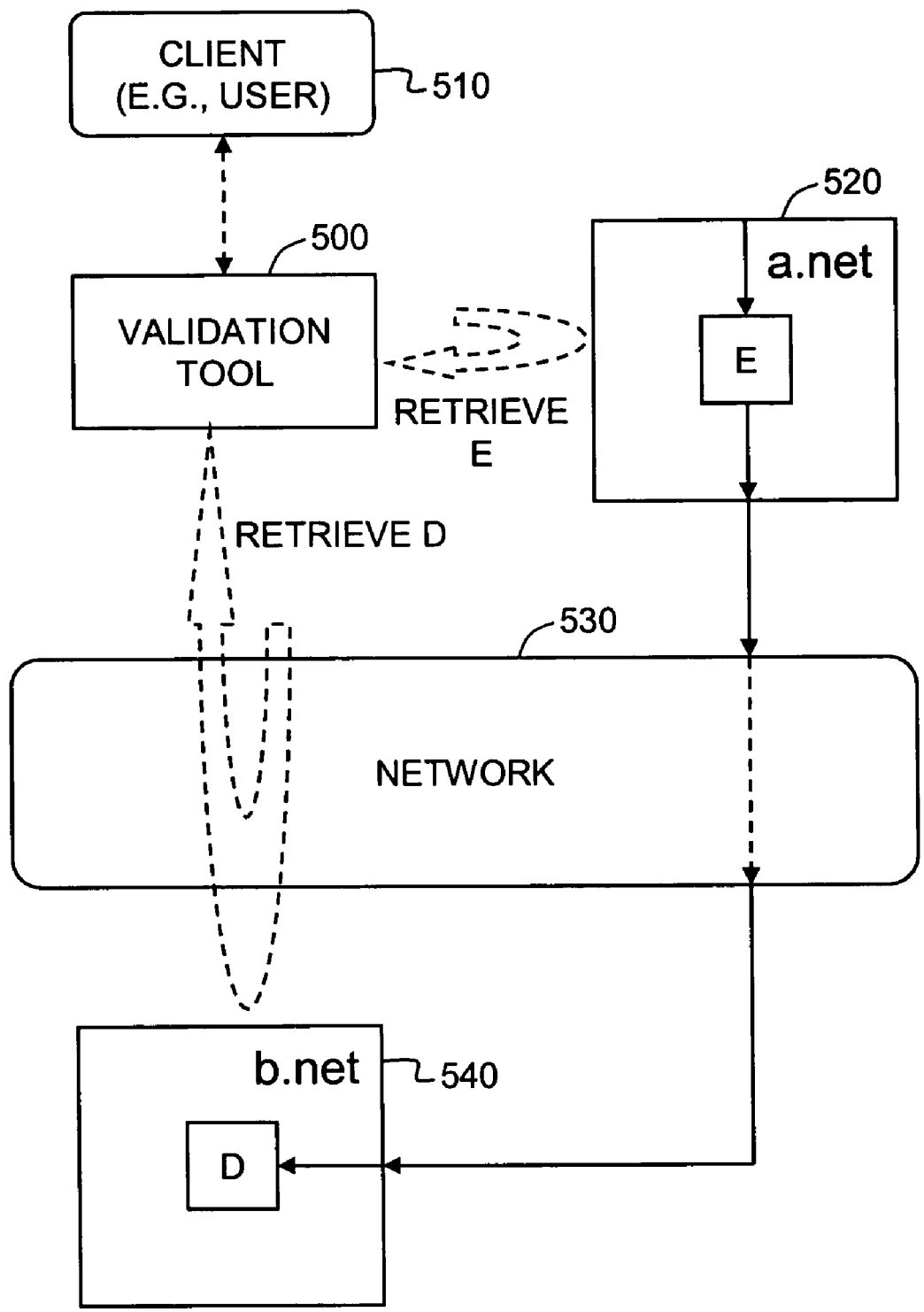
FIG. 5 is a diagram illustrating one example of how the model validation arrangement of FIGS. 1-4 may be applied, in a practical usage scenario.

The concept of an ultimate occurrence, such as an ultimate state change, might include, for example:
- an "outcome" or "output event" in the common usage of the word,
- as a particular example discussed below with reference to FIG. 5: a conclusion as to whether an email is received and successfully decrypted by an intended recipient.

An "internal event" or "internal message" occurs when one node or component of a system passes information or signals a condition that is of potential interest to other nodes or components but which may not be made visible as an output event of the system as a whole. Examples include
- an e-commerce system passing a usage record from a collection point to the billing system,
- an email message being forwarded from a relay server to the recipient's server,
- an SMTP (email transfer) service component notifying an IMAP (email delivery) component of the arrival of a message by writing a file to a particular place in a shared file system.

"Classes." In describing a system's input stimuli, intermediate occurrence responses, and ultimate occurrence responses, it is advantageous to use "classes" to provide a single compact description. For example, an "input event class" may refer to a parameterized description of an input event, and a "response class" may refer to zero, one, or a sequence of possibly-parameterized responses. More specific examples include:
- An input stimulus (e.g., input event) class description [IN! (MAIL ?message)] may refer to a class of all input events of type MAIL (here, the parameter ?message represents a fully determined message).
- An intermediate occurrence response (e.g., internal state change) class description [SET (COUNTER) ?newvalue] may refer to an infinite class of state setting actions that change the value of the variable (COUNTER) to a concrete integer value ?newvalue.
- An ultimate occurrence response (e.g., output event) class description [OUT SEND(?message)] may refer to any one of an infinitude of events (here, the variable ?message represents a fully determined message).

"Behavior description" of a node includes not only "node model" in the common usage of the term (generally, a description of behaviors of a node). The term, node behavior description, also refers to a much broader class of description styles. For example, a node behavior description may include:
- the entire node itself (that is, the code itself) as its own model,
- a "node model" in the common usage of the term,
- a "model instance" in the common usage of the term (based on a node model, but may specify some or all state data values, and/or some or all connections between output events and input events); a model instance may be complete or incomplete, accurate or inaccurate,
- other descriptive styles that are not normally termed "model".

Motivating Example. Referring now to FIG. 5, a first network element 520 is capable of communicating through a network 530 with a second network element 540. Network elements 520, 540 have respective model instances E, D that may be considered part of the same Multi-Stakeholder Distributed System (MSDS). FIG. 5 also shows a validation tool 500 configured to retrieve a model instance E from network element 520 and model instance D from network element 540. A client (user) 510 uses a validation tool 500 that embodies teachings of the present disclosed embodiments. Validation tool 500 can gauge operation of model instances E and D in certain usage scenarios, even when the operational characteristics of model instances E and/or D may be known only incompletely.

An example usage scenario for such a validation process might be as follows:
1. User 510 wants to send a sensitive email message to an intended recipient in "b.net." But user 510 is concerned that the message might not be received or might not be kept private.
2. User 510 expresses to a validation tool 500 that a message is to be sent to the intended recipient. The user also expresses to validation tool 500, the requirements that (1) the message be received and (2) that the message is not to be decipherable by other than the intended recipient.
3. Validation tool 500 uses the arrangements disclosed herein, to compute a tree of possible outcomes resulting from the still-proposed action of sending the message. Possible outcomes include, for example:
   3a. The message is not readable by the recipient (a negative outcome)
   3b. The message is decrypted and leaked to an unintended party (a negative outcome), and
   3c. The message arrives successfully and privately (a positive outcome, in that the user's requirements, expressed above, or a predetermined set of the user's requirements, are met).
4. Validation tool 500 may present these possible outcomes to user 510.
5. User 510, now having been made aware of the possible negative outcomes, may decide to try a test email message first, try an alternate method of communication (use the telephone instead of email), or simply not send the message. In this manner, the user can avoid falling victim to the negative outcomes.

An embodiment of a validation process is explained below, with reference to the flowcharts of FIGS. 1-4. Thereafter, the manner in which that process may be applied in the practical usage scenario is described in detail with reference to FIG. 5.

Embodiments of the Validation Arrangement. From the foregoing motivating example, it is seen that arrangement described herein provides tools to help users, administrators, and developers to comprehend, analyze, and validate correct behavior of transactions in a complex distributed system such as a computer network. The arrangement compensates for incomplete information by leaving "placeholders" in behavior scenarios and presents the user with alternative outcomes based upon different sets of assumptions. In a particular embodiment, automated reasoning techniques, such as logical and functional algebraic simplification, are applied to simplify the resulting symbolic scenarios based upon what information is disclosed.

The present arrangement applies a technique from program optimization and correctness proof to a modeling problem within distributed systems in order to compensate for the missing information.

Debugging distributed systems is known to be difficult and time consuming. Designing new services and nodes to interoperate with existing nodes is also difficult to get right at the detailed level, and users are having more and more difficulty understanding and using feature-rich distributed systems (such as email or web service networks such as proposed and actual supplier management work flow systems).

The conventional approach is to essentially ignore detailed validation questions and abstract to a "black box" level nodes and services controlled by others. The missing information is then not necessary, since the detailed level is ignored. However, this approach also implies that important questions (such as whether an email message will arrive securely at its intended destination) cannot be answered except by trial and error.

A significant difficulty is, as stated above, that stakeholders simply will not divulge all of the information necessary to understand in detail, at the concrete level, what their nodes and services do. One can easily argue that, even though they are likely willing to divulge some information, they will never release all of it. Thus, any technique must tolerate this lack of information. Conventional validation techniques (such as testing or simulation) cannot tolerate this.

Reference is now made to FIGS. 1-4 for a model validation arrangement that overcomes the shortcomings of conventional validation approaches.

FIGS. 1-4 are a flowchart of an embodiment of an arrangement for using symbolic evaluation to validate models that have incomplete information. FIG. 5, which shows one scenario in which the arrangement may find practical application, is discussed after the following general description of FIGS. 1-4.

Referring to FIG. 1, block 102 indicates reception of INPUTS, the input data structure representing an ordered list of input events to be applied to the modeled system.

In block 104, GST denotes the variable that holds the result of the process, a Generalized Scenario Tree (GST). Block 104 initializes the GST to a dummy (no-op) node.

Decision block 106 indicates a determination of whether or not the data structure INPUTS is empty. If the INPUTS data structure is empty, this indicates that the processing is complete and control passes to block 118 for outputting the result GST such as by a return to a higher-level calling program. Thereafter, control may pass to a block 120 representing the output, storage, or other use of the GST such as reading the GST's meaning. In one embodiment, "reading" a GST may be accomplished by a tool that interprets the GST's symbolic description of potential responses of the distributed system, and generates a natural language (for example, English) paraphrasing for output to a client such as a human user. In another embodiment, "reading" may be accomplished by presenting an interactive graphical visualization of the steps of the various potential responses.

However, if the INPUTS data structure is not empty, control passes to block 108.

Block 108 indicates the setting of variable i (a current input event being operated upon) to the first input event of the INPUTS data structure. Step 108 removes this front input event from "Inputs" such as through a "REST(INPUTS)" function, so that INPUTS is smaller for future iterations of the loop.

Block 110 indicates the retrieval, from the MSDS, of the model instance that the input event designates by, for example, a (host, port) specification. Here, (host, port) may be thought of as the unique "coordinates" of a model instance, located somewhere within the MSDS.

Block 112 indicates construction of an input-event-node (one of the types of tree nodes of which a GST is constructed) corresponding to the input event in current input event i. Distinct copies of this input-event-node attach at all fringe nodes (or alternatively at only selected fringe nodes) of the GST, thus making the GST grow. As used herein, a "fringe node" is a node that does not as yet have any children nodes. Each such attached new node is marked as "unprocessed". In addition to attaching new nodes to the growing GST, the system also processes them using process 204, described with reference to FIGS. 2-4. As each node is processed, the system records this fact by marking the node.

Decision block 114 indicates a determination of whether any nodes in the existing GST are as yet unprocessed. If there are no unprocessed nodes in the GST, then control returns to decision block 106. However, if there are unprocessed nodes in the GST, control passes to block 116, one embodiment of which is decomposed in FIG. 2.

Figure 2:
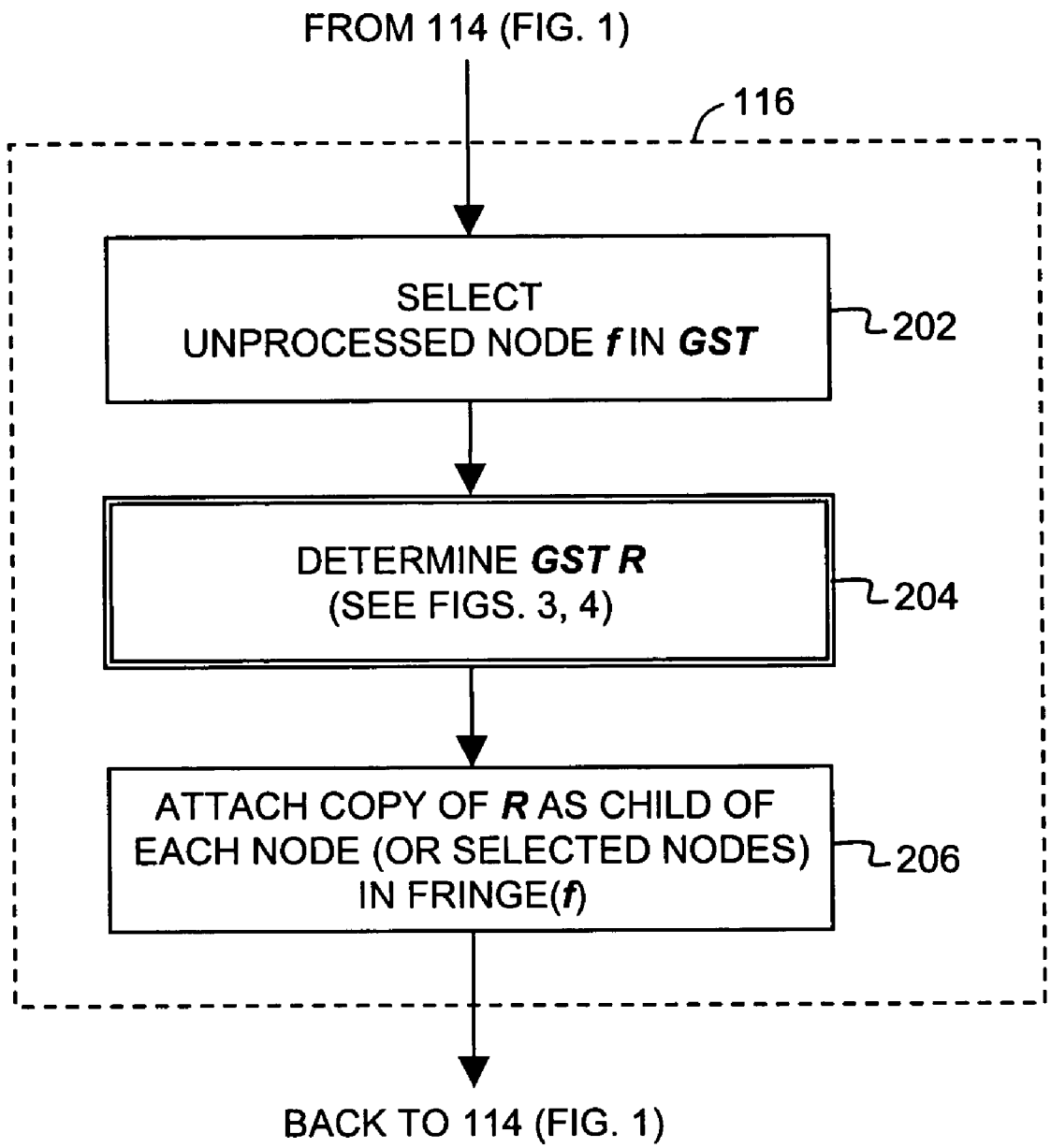

The first block in FIG. 2 is block 202, which indicates selection of an unprocessed node, herein called f, in the GST. Because control reaches block 202 only if the GST contains at least one unprocessed node, this step selects one such node. The present arrangement provides many ways to select the next node to be processed, such as, for example:

Selecting an unprocessed node such that all nodes above it in the tree (i.e. either its parent, its parent's parent, etc.) are already processed.

Selecting an unprocessed node of minimum depth in the tree.

Selecting an unprocessed node of maximum depth having all nodes above it already processed.

Asking an external source (such as a human interactive user) to determine which node should be processed next.

Combining two of the foregoing methods: selecting an unprocessed node such that all nodes above it in the tree are already processed, and asking the external source.

Block 204 indicates application of a method to a node f, yielding a resulting generalized scenario tree R. Block 204 is drawn with double lines to indicate that it may be implemented as a function that may be called recursively. One implementation of block 204 is decomposed in FIGS. 3 and 4, discussed below.

Block 206 indicates attaching the resulting tree R, as determined in block 204, as a child of all fringe nodes, or alternatively only selected fringe nodes, that are below (or equal to) f. Thereafter, control returns to FIG. 1 block 114 for determination of whether there are still any unprocessed nodes in the GST.

A process by which block 204 may be implemented is now explained with reference to the flowchart of FIGS. 3 and 4. Using terms and symbols to be used immediately hereafter, block 204 takes a Generalized Scenario Tree (GST) node g as input, and then computes a new GST R corresponding to the elaboration of the input node according to model evaluation semantics. If block 204 is implemented as a called function, the new GST may be returned to the calling process as a value of the called function before control returns to FIG. 2 block 206.

Figure 3:
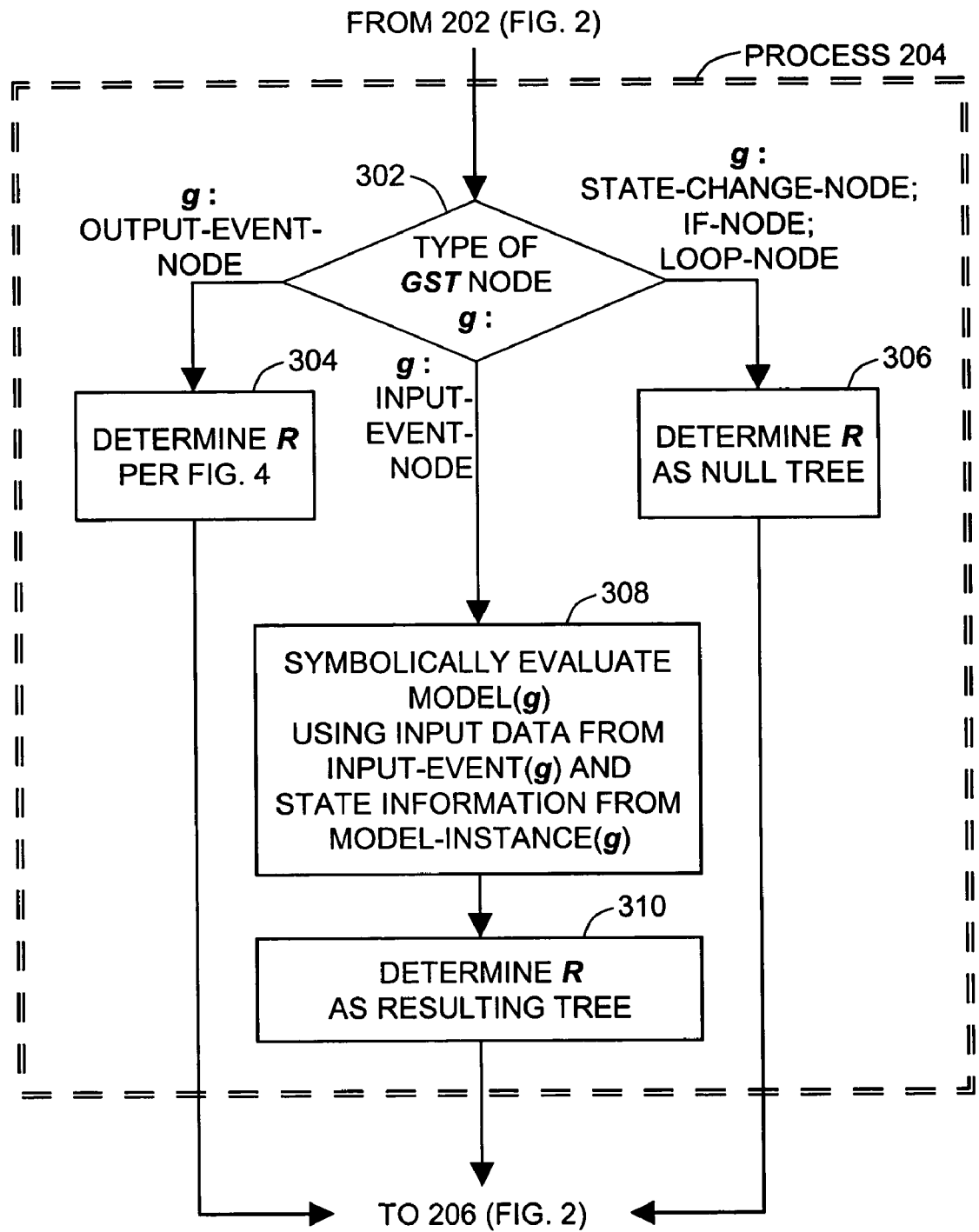

Referring to FIG. 3, decision block 302 indicates a multiway decision branch that may be implemented, for example, as a "switch" statement. (The following description of FIG. 3 refers to various data entries that, for completeness, are described below in the paragraphs following the sub-heading "Data Entities.") In FIG. 3, branching from decision block 302 is determined by the specific type of the input node g:

If g is of type "output-event-node" then the branch is taken to block 304, which determines R in accordance with FIG. 4 (described below).

If g is of type "input-event-node" then the branch is taken to block 308 (described below).

If g is of any other type node (such as a state-change-node, an if-node, a loop-node), then the branch is taken to block 306, which determines R to be a null tree (communicating a null result to any calling function).

Block 308 is executed when g is of type input-event-node. Accordingly, it may be assumed that g includes the following information and specifications:

model(g) is a description of the behavior of a node of the MSDS in some modeling language (broadly construed, a "modeling language" could be simply a programming language or a higher level modeling language).

input-event(g) describes the specific operation and parameters to be applied at the described node at the current point in the distributed computation.

model-instance(g) describes the current modeled state of the executing state machine described by model(g) at the modeled node, as well as information describing the connections of the modeled node with other nodes in the MSDS, denoted connections(g).

Block 308 applies the well known symbolic evaluation technique to model(g) using input data from input-event(g) and state information from model-instance(g). (Concerning symbolic evaluation techniques, see, for example, N. Jones, C. Gomard, and P. Sestoft, *Partial Evaluation and Automatic Program Generation*, Prentice-Hall (1993), which is incorporated herein by reference in its entirety.) As is well known in the art, the result is a symbolic description of possible entire executions (or merely possible outcomes), which are here represented as a generalized scenario tree R.

Block 310 indicates that R is determined to be the tree resulting from the symbolic evaluation conducted in block 308. If process 204 is a called function, R may be returned to the calling process as a value of the called function before control returns to FIG. block 206.

Figure 4:
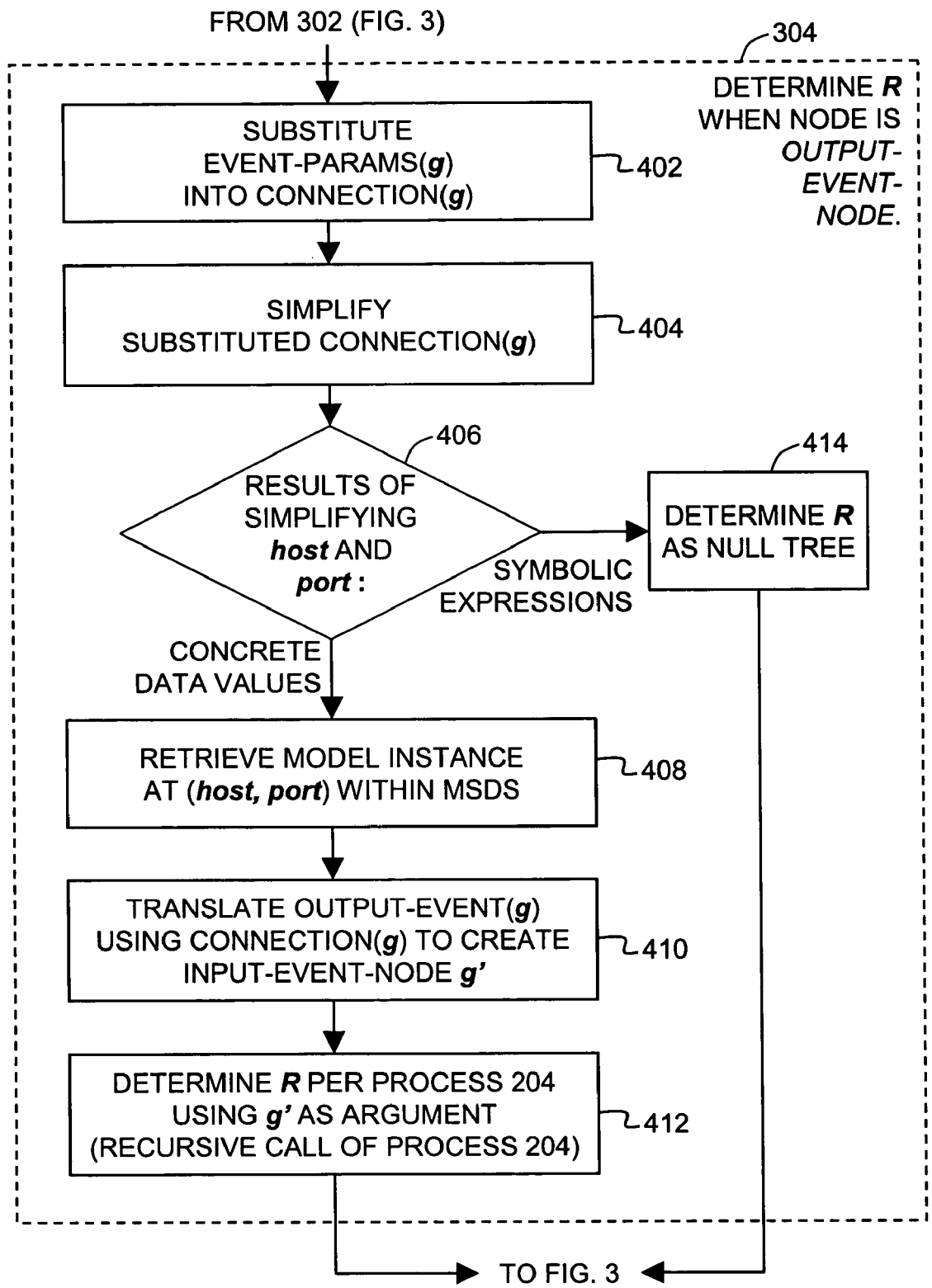

Referring now to FIG. 4, one decomposition of FIG. 3 block 304 is shown as a flowchart. Block 402 indicates the substitution of parameters of output-event(g) into the expressions of connections(g).

Block 404 indicates application of symbolic automated reasoning, well known in the art, to simplify the host and port expressions in the substituted connections(g).

Decision block 406 indicates the determination of whether the results of simplifying the host and port expressions are concrete data values (as opposed to remaining indefinite symbolic expressions). If the results of simplifying the host and port expressions are indefinite symbolic expressions, then control passes to block 414 which determines R to be a null tree before control returns to FIG. 3. However, if the results of simplifying the host and port expressions are concrete data values, then control passes to block 408.

Block 408 indicates the access of the MSDS infrastructure to retrieve the model instance information at (host, port) of the MSDS. Publishing and retrieval can be implemented in a number of ways, including, for example:

a fully distributed approach, in which each node publishes its own model instances, a registry-based approach, in which a central registry stores and distributes models of all nodes, retrieving the node behavior description from a central registry, retrieving the node behavior description using a central registry, such as Napster, web services UDDI framework, Java Jini technology, and so forth, retrieving the node behavior description using a distributed registry, such as Internet Domain Name System, Gnutella, KaZaa, and so forth, an approach in which the model instance information is stored locally in disk files, allowing validation tool user 510 (FIG. 5) to obtain model instances in advance through some means and simply store them, other approaches not specifically listed, and combinations of the above, mixed arbitrarily in an MSDS.

Block 410, predicated on the g being an output-event-node, indicates substitution of the data obtained from the parameters of output-event(g) into the translated-event expression of connection(g). This results in an input-event expression that is then incorporated into a new input-event-node g'.

Finally, block 412 indicates the determination of R by recursively invoking (or otherwise carrying out the functions of) process 204, using g' as a node argument instead of g. Symbolically, this invocation may be represented as R=Process(g'). Control then returns to FIG. 3, with R bearing the result of that recursive invocation.

Data Entities. The foregoing description of FIG. 3 refers to various data entries. For completeness, the following description of one implementation of those data entities is provided. Generalized Scenario Tree (GST) node types include types (A) through (E):

(A) input-event-node X: This type of node represents application of an input event to a state machine representing a running MSDS node at a given instant of time.

A1) input-event(X)=operation plus parameters to be applied as inputs.

A2) model(X)=behavioral description of MSDS node to which input event is to be applied.

A3) model-instance(X) contains:

A3a) state(X)=representation of some, but, significantly, not necessarily all, current variable values ("state") of MSDS node to which input event is to be applied.

A3b) connections(X) maps each output event type T (those that can be produced by action of model(X)) into a connection structure C[T]:

A3b1) host(C[T])=expression yielding ID of host to send event to.

A3b2) port(C[T])=expression yielding port at host to send event to.

A3b3) translated-event(C[T])=how to convert output events of type T into appropriate input-events prior to sending to host and port.

(B) output-event-node X: This type of node represents the communication of some output result(s) from one running MSDS node to the input of another running MSDS node at a particular instant of time.

output-event(X)=labeled (typed) set of output values obtained from execution of a model on an input event.

model-instance(X)=model instance (as above) describing the MSDS node that produced the output event described by g.

(C) state-change-node X represents the change of a state variable during the computation resulting from applying an input event to a running MSDS node at a given time.

(D) if-node X represents a branch (based upon a condition predicate) in the computation resulting from applying an input event to a running MSDS node at a given time.

(E) loop-node X represents the iteration of a sub-computation resulting from applying an input event to a running MSDS node at a given time.

Applications. Advantageously, the present arrangement is applicable to modeling of any multistakeholder distributed system (MSDS). Examples of MSDSs include:

Internet email networks,

Web service networks,

Telephone and Voice-over-IP networks,

Networks of distributed objects (such as CORBA based distributed network management systems, for example), Enterprise Application Integration scenarios (e.g. one company buys or merges with another and wishes to integrate their IT infrastructures), Other distributed systems not specifically listed.

Example: practical application: Email. FIG. 5 depicts a two-node MSDS having model instances "E" and "D" that are assumed to be running at respective network elements 520 ("a.net") and 540 ("b.net"), on port 625 of each. FIG. 5 also shows a client (user) 510 and a validation tool 500 configured to retrieve the model instance information for E and D.

Table I shows information assumed to be contained in model instance E:

TABLE I

Model Instance E

Model:
  (spec ENCRYPT
    (include-theory email-theory)
    (handler (OUTGOING (?m MSG))
      (let* ((?rand (gen (lookup random-seed)))
        (?newseed (next (lookup random-seed))))
      (output-event (mail (enc-msg ?m (lookup pubkey
                                (recip ?m)) ?rand)))
      (set random-seed ?newseed))))
Instance Data:
  (pubkey "cw@b.net") = "a1b2c3"
Connections:
  [For output event (MAIL ?m):
    Host = (hostpart (recip ?m))
    Port = 625
    InputEvent = (RECEIVE ?m)]

Table II shows information assumed to be contained in model instance D:

TABLE II

Model Instance D

Model:
  (spec DECRYPT
    (include-theory email-theory)
    (handler (RECEIVE (?m MSG))
      (let* ((?mykey (lookup my-private-key)))
      (if (decrypts? ?m ?mykey)
        (output-event (deliver (decrypt-msg ?m ?mykey)))
        (output-event (deliver ?m))))))
Instance Data:
  (my-private-key) = ? <decline to publish>
Connections:
  <none>

An example of a Requirement that the user 510 states to tool 500 is shown (in colloquial language) in Table III:

TABLE III

User's "Requirement"

User wishes to send message M= ["to: cw@b.net, Hi."] privately.

In the following description of a particular example of an application of the validation tool 500 (FIG. 5):
  numbers in angle brackets < >refer to reference numerals from the flowcharts of FIGS. 1-4;
  GST nodes are denoted by numbers in braces {0}; nodes are connected by lines ("connections");
  network element 520 is arbitrarily designated "a.net";
  network element 540 is arbitrarily designated "b.net"; and
  the port designation "625" is arbitrary and non-limiting.

<102>
  Inputs = (["to: cw@b.net, Hi." applied to "a.net" port 625])
<104>
  GST := {0}* where {0} is a dummy GST node. An asterisk indicates that a node is already "processed" within the meaning of decision block 114; processing of dummy node does nothing.

<106>
  Determine "Inputs" is not empty
<108>
  i:=["to: cw@b.net, Hi."applied to "a.net" port 625]
  Inputs := ( )
<110>
  Retrieve the model instance E on "a.net" port 625.
<112>

```
GST :=      {0}*
             |
            {1}
``` in which {1} is the node [IN! (OUTGOING "to: cw@b.net, Hi."), applied to E].

<114>
  Determine that an unprocessed f exists
<116/202>
  f := {1}
<302> (within <204>)
  g is found to be an input event node.
<308/310> (within <204>)

Apply symbolic evaluation to model for E with given inputs, so as to determine R:

```
R: =      {2}
           |
          {3}
``` in which:
  {2} is the node
[OUT (MAIL (enc-msg "to: cw@b.net, Hi.", "a1b2c3", gen(lookup random-seed)))]
  {3} is the node [SET random-seed (next (lookup random-seed))]

<206/116>

```
GST =      {0}*
            |
           {1}*
            |
           {2}
            |
           {3}
```

<114>
  Determine that a next unprocessed f exists
<116/202>
  f:= {2}
<302>
  g :=f (g has type output-event-node)
<402>
  Host := (hostpart (recip (enc-msg "to:cw@b.net,Hi.", 'a1b2c3",gen(lookup random-seed))
  Port := 625
<404>
  Applying automated reasoning:
  Host := "b.net", Port := 625

-continued

<406>
    Determine that (host, port) are concrete data.
<408>
    Retrieve model instance D from Host "b.net", port 625.

New input event to be applied to D is produced by substituting into E's connection's "InputEvent" expression and applying automated reasoning:

<410>
    [IN! (RECEIVE (enc-msg "to: cw@b.net, Hi.", "a1b2c3", gen(lookup random-seed)))]
<412>
    Recursive call of process 204.
<302/304>
    Determine that g' is input-event-node constructed in <410> above
<308/310/412>

Compute new R by applying symbolic evaluation to model of D, using given input:

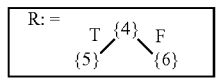

where:
{4} is the if-node [IF (decrypts? (enc-msg "to: cw@b.net, Hi.", "a1b2c3", gen(lookup random-seed)), (lookup my-private-key))]
{5} is output-event-node
[OUT (DELIVER (decrypt-msg (enc-msg "to: cw@b.net, Hi.", "a1b2c3", gen(lookup random-seed)), (lookup my-private-key)))]
{6} is output-event-node
[OUT (DELIVER (enc-msg "to: cw@b.net, Hi.", "a1b2c3", gen(lookup random-seed)))]

Here, the "T" (for "True") indicates that {5} follows {4} if the decision predicate in {4} evaluates to true, while the "F" (for "False") indicates that {6} follows {4} otherwise.

<206/116>
Determine GST:

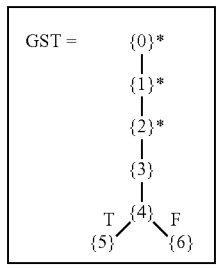

Further computation, involving processing nodes 3 through 6 in accordance with FIGS. 1-4, results in no further nodes being added to the tree.
<120>
As a result of processing in this example, possible outcome classes are read off the GST as individual root-to-leaf paths. Thus, in this example, behaviors include:

{0}-{1}-{2}-{3}-{4}-{5} is represents a successful behavior, meeting the user's requirements: the message is received by the intended recipient and is also decrypted correctly.

{0}-{1}-{2}-{3}-{4}-{6} represents an unsuccessful behavior (or "failure" behavior) because the private key did not correctly decrypt the message.

Of course, as noted above, the foregoing example of application to an email system is only one of a plethora of applications in which the present invention is useful.

More generally, also provided, for the methods described herein, are computer program products (such as storage media) storing computer executable code or program instructions for execution on a computer system having at least one data processing device, which code or instructions when executed by the computer system cause the computer system to perform the methods described herein.

Further provided are systems for performing the methods described herein, the systems including at least one data processing element. Generally, these elements may be implemented as any appropriate computer(s) employing technology known by those skilled in the art to be appropriate to the functions performed. The computer(s) may be implemented using a conventional general purpose computer programmed according to the foregoing teachings, as will be apparent to those skilled in the computer art. Appropriate software can readily be prepared by programmers based on the teachings of the present disclosure. Suitable programming languages operating with available operating systems may be chosen.

General purpose computers may implement the foregoing methods, in which the computer housing may house a CPU (central processing unit), memory such as DRAM (dynamic random access memory), ROM (read only memory), EPROM (erasable programmable read only memory), EEPROM (electrically erasable programmable read only memory), SRAM (static random access memory), SDRAM (synchronous dynamic random access memory), and Flash RAM (random access memory), and other special purpose logic devices such as ASICs (application specific integrated circuits) or configurable logic devices such GAL (generic array logic) and reprogrammable FPGAs (field programmable gate arrays).

Each computer may also include plural input devices (for example, keyboard, microphone, and mouse), and a display controller for controlling a monitor. Additionally, the computer may include a floppy disk drive; other removable media devices (for example, compact disc, tape, and removable magneto optical media); and a hard disk or other fixed high-density media drives, connected using an appropriate device bus such as a SCSI (small computer system interface) bus, an Enhanced IDE (integrated drive electronics) bus, or an Ultra DMA (direct memory access) bus. The computer may also include a compact disc reader, a compact disc reader/writer unit, or a compact disc jukebox, which may be connected to the same device bus or to another device bus.

The arrangement provides at least one computer readable medium. Examples of computer readable media include compact discs, hard disks, floppy disks, tape, magneto optical disks, PROMs (for example, EPROM, EEPROM, Flash EPROM), DRAM, SRAM, SDRAM.

Stored on any one or on a combination of computer readable media is software for controlling both the hardware of the computer and for enabling the computer to interact with other elements, to perform the functions described above. Such software may include, but is not limited to, user applications, device drivers, operating systems, development tools, and so forth.

Such computer readable media further include a computer program product including computer executable code or computer executable instructions that, when executed, causes a computer to perform the methods disclosed above. The computer code may be any interpreted or executable code, including but not limited to scripts, interpreters, dynamic link libraries, Java classes, complete executable programs, and the like.

From the foregoing, it will be apparent to those skilled in the art that a variety of methods, systems, computer programs on recording media, and the like, are provided.

For example, the present disclosure supports a method for calculating a description of potential responses of a distributed system in response to at least one input stimulus, the distributed system including nodes whose operation is described by respective node behavior descriptions. The method may involve applying symbolic evaluation to plural node behavior descriptions so as to produce plural response descriptions that describe responses of nodes; and combining at least the plural response descriptions so as to arrive at the description of potential responses of the distributed system.

At least some of the node behavior descriptions may be incomplete or inaccurate.

The producing and combining steps may collectively constitute incrementally forming a generalized scenario tree (GST) from which the description of potential responses of the distributed system may be derived.

The method of may further involve selecting a next node behavior description from the GST to process, in order to carry out a next iteration of the response description producing step, the selecting step being chosen from a group including:
  selecting, as the next node behavior description from the GST to process, an unprocessed node behavior description such that all node behavior descriptions above the unprocessed node behavior description in the GST have already been processed;
  selecting, as the next node behavior description from the GST to process, an unprocessed node behavior description of minimum depth in the GST such that all node behavior descriptions above the unprocessed node behavior description have already been processed;
  selecting, as the next node behavior description from the GST to process, an unprocessed node behavior description of maximum depth in the GST, such that all node behavior descriptions above the unprocessed node behavior description have already been processed;
  selecting, as the next node behavior description from the GST to process, an unprocessed node behavior description specified by a client; and
  selecting, as the next node behavior description from the GST to process, an unprocessed node behavior description specified by a human user.

The method may further involve using connector information from a first node behavior description to determine which second node behavior description should receive a previously-produced response description as a new input stimulus description.

The method may further involve retrieving at least one node behavior description, the retrieving step being selected as at least one from a group of retrieving steps including:
  retrieving the node behavior descriptions from respective nodes in the distributed system, wherein plural model instances are fully distributed throughout the distributed system at respective nodes;
  retrieving the node behavior descriptions from respective nodes in the distributed system, wherein some but fewer than all of the plural node behavior descriptions are stored throughout the distributed system at respective nodes;
  retrieving the node behavior description from a central registry;
  retrieving the node behavior description using a central registry;
  retrieving the node behavior description using a distributed registry;
  retrieving the node behavior description from a storage location that is local to a validation tool that carries out the calculating method.

The connector information using step may include simplifying a (host, port) expression that is referenced by the connector information, the (host, port) expression defining a coordinate of a node behavior description in the distributed system, determining whether the simplified (host, port) expression is a concrete data value or an indefinite expression, and if the simplified (host, port) expression is a concrete data value, determining the second node behavior description as that corresponding to the coordinates within the distributed system defined by the simplified (host, port) expression.

The connector information using step may include simplifying a (host, port) expression that is referenced by the connector information, the (host, port) expression defining a coordinate of a node behavior description in the distributed system, determining whether the simplified (host, port) expression is a concrete data value or an indefinite expression, and if the simplified (host, port) expression is an indefinite expression, determining the second node behavior description as that corresponding to the coordinates within the distributed system defined by the simplified (host, port) expression.

The method may further involve inputting, from a client, at least one requirement describing at least one input stimulus description. The method may further involve, in response to the input requirement, outputting the description of potential responses of the distributed system.

The method may further involve inputting, from a client, at least one requirement describing at least one criterion describing acceptable responses of the distributed system. The method may further involve, in response to the input requirement, outputting a description of at least one potential response of the distributed system that does not satisfy the at least one requirement.

The present disclosure also supports a computer program product including computer executable code or computer executable instructions that, when executed, cause a computer to perform the methods described herein.

The present disclosure further supports a system configured to perform the methods described herein.

Many alternatives, modifications, and variations will be apparent to those skilled in the art in light of the above teachings. For example, there are many ways to implement embodiments, including choices of description language, choice of reasoning technology, and designs of protocols for exchanging partial information. It is therefore to be understood that within the scope of the appended claims and their equivalents, the invention may be practiced otherwise than as specifically described herein.

What is claimed is:

1. A method for calculating a description of potential responses of a distributed system in response to at least one input stimulus, the distributed system including nodes whose operation is described by respective node behavior descriptions, the method comprising:

applying symbolic evaluation to plural node behavior descriptions so as to produce plural response descriptions that describe responses of nodes;

combining at least the plural response descriptions so as to arrive at the description of potential responses of the distributed system; and in response to an input requirement that is input from a client, outputting a description of at least one potential response of the distributed system;

wherein at least some of the node behavior descriptions are incomplete or inaccurate.

2. A method for calculating a description of potential responses of a distributed system in response to at least one input stimulus, the distributed system including nodes whose operation is described by respective node behavior descriptions, the method comprising:

applying symbolic evaluation to plural node behavior descriptions so as to produce plural response descriptions that describe responses of nodes;

combining at least the plural response descriptions so as to arrive at the description of potential responses of the distributed system; and in response to an input requirement that is input from a client, outputting a description of at least one potential response of the distributed system;

wherein the producing and combining steps collectively constitute:

incrementally forming a generalized scenario tree (GST) from which the description of potential responses of the distributed system may be derived.

3. The method of claim 2, further comprising:

selecting a next node behavior description from the GST to process, in order to carry out a next iteration of the response description producing step, the selecting step being chosen from a group including:

selecting, as the next node behavior description from the OST to process, an unprocessed node behavior description such that all node behavior descriptions above the unprocessed node behavior description in the GST have already been processed;

selecting, as the next node behavior description from the GST to process, an unprocessed node behavior description of minimum depth in the GST such that all node behavior descriptions above the unprocessed node behavior description have already been processed;

selecting, as the next node behavior description from the GST to process, an unprocessed node behavior description of maximum depth in the GST, such that all node behavior descriptions above the unprocessed node behavior description have already been processed;

selecting, as the next node behavior description from the GST to process, an unprocessed node behavior description specified by a client; and selecting, as the next node behavior description form the GST to process, an unprocessed node behavior description specified by a human user.

4. A method for calculating a description of potential responses of a distributed system in response to at least one input stimulus, the distributed system including nodes whose operation is described by respective node behavior descriptions, the method comprising:

applying symbolic evaluation to plural node behavior descriptions so as to produce plural response descriptions that describe responses of nodes;

combining at least the plural response descriptions so as to arrive at the description of potential responses of the distributed system;

using connector information from a first node behavior description to determine which second node behavior description should receive a previously-produced response description as a new input stimulus description; and in response to an input requirement that is input from a client, outputting a description of at least one potential response of the distributed system.

5. The method of claim 4, further comprising:

retrieving at least one node behavior description, the retrieving step being selected as at least one from a group of retrieving steps including:

retrieving the node behavior descriptions from respective nodes in the distributed system, wherein plural model instances are fully distributed throughout the distributed system at respective nodes;

retrieving the node behavior descriptions from respective nodes in the distributed system, wherein some but fewer than all of the plural node behavior descriptions are stored throughout the distributed system at respective nodes;

retrieving the node behavior description from a central registry;

retrieving the node behavior description using a central registry;

retrieving the node behavior description using a distributed registry; and retrieving the node behavior description from a storage location that is local to a validation tool that carries out the calculating method.

6. The method of claim 4, wherein the connector information using step includes:

simplifying a (host, port) expression that is referenced by the connector information, the (host, port) expression defining a coordinate of a node behavior description in the distributed system;

determining whether the simplified (host, port) expression is a concrete data value or an indefinite expression; and if the simplified (host, port) expression is a concrete data value. determining the second node behavior description as that corresponding to the coordinates within the distributed system defined by the simplified (host, port) expression.

7. The method of claim 4, wherein the connector information using step includes:

simplifying a (host, port) expression that is referenced by the connector information, the (host, port) expression defining a coordinate of a node behavior description in the distributed system;

determining whether the simplified (host, port) expression is a concrete data value or an indefinite expression; and if the simplified (host, port) expression is an indefinite expression, determining the second node behavior description as that corresponding to the coordinates within the distributed system defined by the simplified (host, port) expression.

8. A method for calculating a description of potential responses of a distributed system in response to at least one input stimulus, the distributed system including nodes whose operation is described by respective node behavior descriptions, the method comprising:

inputting, from a client, at least one requirement describing at least one input stimulus description;

applying symbolic evaluation to plural node behavior descriptions so as to produce plural response descriptions that describe responses of nodes;

combining at least the plural response descriptions so as to arrive at the description of potential responses of the distributed system; and in response to the input requirement, outputting a description of at least one potential response of the distributed system.

9. The method of claim 8, further comprising:

in response to the input requirement, outputting the description of potential responses of the distributed system.

10. A method for calculating a description of potential responses of a distributed system in response to at least one input stimulus, the distributed system including nodes whose operation is described by respective node behavior descriptions, the method comprising:

inputting, from a client, at least one requirement describing at least one criterion describing acceptable responses of the distributed system;

applying symbolic evaluation to plural node behavior descriptions so as to produce plural response descriptions that describe responses of nodes;

combining at least the plural response descriptions so as to arrive at the description of potential responses of the distributed system; and in response to the input requirement, outputting a description of at least one potential response of the distributed system.

11. The method of claim 10, further comprising:

in response to the input requirement, outputting a description of at least one potential response of the distributed system that does not satisfy the at least one requirement.

12. A computer-readable medium storing computer executable code or computer executable instructions that, when executed, cause a computer to perform a method for calculating a description of potential responses of a distributed system in response to at least one input stimulus, the distributed system including nodes whose operation is described by respective node behavior descriptions, the method comprising:

applying symbolic evaluation to plural node behavior descriptions so as to produce plural response descriptions that describe responses of nodes;

combining at least the plural response descriptions so as to arrive at the description of potential responses of the distributed system; and in response to an input requirement that is input from a client, outputting a description of at least one potential response of the distributed system;

wherein the producing and combining steps collectively constitute:

incrementally forming a generalized scenario tree (GST) from which the description of potential responses of the distributed system may be derived.

13. The computer-readable medium of claim 12 wherein at least some of the node behavior descriptions are incomplete or inaccurate.

14. The computer-readable medium of claim 12 wherein the instructions further cause the computer to further perform using connector information from a first node behavior description to determine which second node behavior description should receive a previously-produced response description as a new input stimulus description.

15. The computer-readable medium of claim 14 wherein said using connector information includes:

simplifying a (host, port) expression that is referenced by the connector information, the (host, port) expression defining a coordinate of a node behavior description in the distributed system;

determining whether the simplified (host, port) expression is a concrete data value or an indefinite expression; and if the simplified (host, port) expression is a concrete data value, determining the second node behavior description as that corresponding to the coordinates within the distributed system defined by the simplified (host, port) expression.

16. A computer-controlled apparatus having a processor and a memory, the memory having stored instructions which, when executed by the processor, cause the computer-controlled apparatus to perform a method for calculating a description of potential responses of a distributed system in response to at least one input stimulus, the distributed system including nodes whose operation is described by respective node behavior descriptions, the method comprising:

applying symbolic evaluation to plural node behavior descriptions so as to produce plural response descriptions that describe responses of nodes;

combining at least the plural response descriptions so as to arrive at the description of potential responses of the distributed system; and in response to an input requirement that is input from a client, outputting a description of at least one potential response of the distributed system;

wherein the producing and combining steps collectively constitute:

incrementally forming a generalized scenario tree (OST) from which the description of potential responses of the distributed system may be derived.

17. The computer-controlled apparatus of claim 16 wherein at least some of the node behavior descriptions are incomplete or inaccurate.

18. The computer-controlled apparatus of claim 16 wherein the instructions cause the computer-controlled apparatus to further perform using connector information from a first node behavior description to determine which second node behavior description should receive a previously-produced response description as a new input stimulus description.

19. The computer-controlled apparatus of claim 18 wherein said using connector information includes:

simplifying a (host, port) expression that is referenced by the connector information, the (host, port) expression defining a coordinate of a node behavior description in the distributed system;

determining whether the simplified (host, port) expression is a concrete data value or an indefinite expression; and if the simplified (host, port) expression is a concrete data value, determining the second node behavior description as that corresponding to the coordinates within the distributed system defined by the simplified (host, port) expression.

* * * * *